(12) United States Patent
Wu et al.

(10) Patent No.: US 12,151,221 B1
(45) Date of Patent: Nov. 26, 2024

(54) METHOD OF BOTTOM-ENTRY MAGNETIC STIRRING DEVICE

(71) Applicant: ZHEJIANG GREATWALL MIXERS CO., LTD., Wenzhou (CN)

(72) Inventors: Liang Wu, Wenzhou (CN); Zhigeng Zhang, Wenzhou (CN); Zhijian Huang, Wenzhou (CN); Xu Xu, Wenzhou (CN); Bingxin Wang, Wenzhou (CN); Yulao Zhang, Wenzhou (CN); Benchi Xu, Wenzhou (CN); Minghui Xie, Wenzhou (CN); Xuxing Cheng, Wenzhou (CN); Wenjiang Wu, Wenzhou (CN)

(73) Assignee: ZHEJIANG GREATWALL MIXERS CO., LTD., Wenzhou (CN)

( * ) Notice: Subject to any disclaimer, the term of this patent is extended or adjusted under 35 U.S.C. 154(b) by 0 days.

(21) Appl. No.: 18/434,897

(22) Filed: Feb. 7, 2024

(30) Foreign Application Priority Data

Aug. 3, 2023 (CN) .......................... 202310974282.4

(51) Int. Cl.
*G06F 30/20* (2020.01)
*B01F 33/453* (2022.01)

(52) U.S. Cl.
CPC ...... *B01F 33/4534* (2022.01); *B01F 33/4535* (2022.01); *G06F 30/20* (2020.01)

(58) Field of Classification Search
CPC .......... B01F 13/0827–089; B01F 13/08; B01F 13/0818; B01F 33/4531; B01F 33/452; B01F 33/4532; B01F 35/513; B01F 35/5312; B01F 35/60; B01F 2035/352; B01F 2101/22; B01F 2101/44; B01F 33/4534; B01F 33/4535; G06F 30/20
USPC ...................................... 416/3; 366/273–274
See application file for complete search history.

(56) References Cited

U.S. PATENT DOCUMENTS

| | | | | |
|---|---|---|---|---|
| 4,993,841 A | * | 2/1991 | Lofgren | B01F 33/4535 366/331 |
| 5,393,142 A | * | 2/1995 | Meier | B01F 33/4535 366/314 |
| 5,407,272 A | * | 4/1995 | Meier | B01F 33/4535 366/314 |

(Continued)

FOREIGN PATENT DOCUMENTS

WO   WO-2014180954 A1 * 11/2014 .......... B01F 13/0845

*Primary Examiner* — Charles Cooley
(74) *Attorney, Agent, or Firm* — Ying-Ting Chen

(57) ABSTRACT

A design method of bottom-entry magnetic stirring device is disclosed in which the stirring device includes an impeller assembly and an isolation sleeve which are connected axially in a movable manner. The isolation sleeve restricts the axial movement distance of the impeller assembly through the principle of magnetic levitation. The impeller assembly is suitable for driving the material in the middle of the stirring tank to move downwards. The isolation sleeve is set with downward magnetic force towards the impeller assembly, and the impeller assembly is in a suspended state when rotating, satisfying the formula Fvi+Ff=G+Fc. Thus, in the case of known impeller thrust Fvi or repulsive force Fc between magnets, the repulsive force Fc between magnets or impeller thrust Fvi can be obtained, thereby obtaining the design parameters of the magnets and the rotating speed of the drive shaft when it rotates stably.

8 Claims, 2 Drawing Sheets

(56) References Cited

U.S. PATENT DOCUMENTS

| | | | | |
|---|---|---|---|---|
| 6,065,865 A * | 5/2000 | Eyraud | ............... | B01F 33/4535 |
| | | | | 366/314 |
| 2004/0076076 A1* | 4/2004 | Hoobyar | ............... | B01F 33/453 |
| | | | | 366/273 |
| 2006/0221765 A1* | 10/2006 | Andersson | ............... | F16C 17/02 |
| | | | | 366/273 |
| 2007/0036027 A1* | 2/2007 | Meier | ..................... | F16C 17/10 |
| | | | | 366/273 |
| 2010/0309746 A1* | 12/2010 | Andersson | ............ | B01F 27/808 |
| | | | | 366/165.3 |

* cited by examiner

METHOD OF BOTTOM-ENTRY MAGNETIC STIRRING DEVICE

BACKGROUND OF THE PRESENT INVENTION

Field of Invention

The present invention relates to the field of magnetic stirring, particularly to a design method of bottom-entry magnetic stirring device.

Description of Related Arts

Currently, a bottom-entry magnetic stirring device is suitable for installation at the bottom of a stirring tank. The magnetic stirring device includes an isolation sleeve and an impeller assembly. The isolation sleeve is installed at the bottom of the stirring tank and is set along the vertical direction. The isolation sleeve is equipped with a driving shaft. The impeller assembly is sleeved outside the isolation sleeve and is set inside the stirring tank. The driving shaft is capable of driving the impeller assembly to rotate through magnetic transmission. Specifically, the outer periphery of the driving shaft is equipped with a driving magnet, and the impeller assembly is equipped with a transmission magnet that cooperates with the driving magnet, and the transmission magnet and the driving magnet are magnetically attracted to each other. The rotation of the driving shaft will drive the driving magnet to rotate, thereby driving the transmission magnet to transmit motion, and further driving the impeller assembly connected to the transmission magnet to rotate.

However, the current bottom-entry magnetic stirring structure has the following defects: the conventional magnetic stirring device usually drives the material in the middle of the stirring tank to move upward, facilitating the stirring operation. However, during actual use, the magnetic stirring device is prone to wear, causing contamination of materials that require a high level of hygiene (such as in the pharmaceutical industry). Additionally, residues of materials are easily left on the magnetic stirring device, making cleaning difficult. Therefore, redesigning the bottom-entry magnetic stirring device and its parameters is a problem that technical person in this field need to solve.

SUMMARY OF THE PRESENT INVENTION

The object of the present invention is to provide a design method of magnetic stirring device that is not easily prone to material contamination and the residue of the material is not easy to be retained.

In order to achieve the above object, the technical solution of the present application is a design method of bottom-entry magnetic stirring device, wherein the stirring device comprise an impeller assembly and an isolation sleeve, wherein the impeller assembly and the isolation sleeve are connected along an axial direction in a movable manner, wherein the isolation sleeve restricts the axial movement distance of the impeller assembly through the principle of magnetic levitation, wherein the impeller assembly is arranged for driving a material in the middle of the stirring tank to move downward, wherein a downward component force through the magnetic coupling between the isolation sleeve and the impeller assembly is generated, and the impeller assembly is in a suspended state during rotating, wherein the design method comprises the following steps:

S100, according to the physical shape of a conventional impeller assembly, analyzing the weight m and the volume Vf of the impeller assembly by simulation software;

S200, calculating the gravity $G=m \times g$ and buoyancy $Ff=\rho_{liquid} \times g \times Vf$ of the impeller assembly, and taking $\rho_{liquid}=1.0 \times 10^3$ kg/m$^3$, $g=9.8$ N/kg;

S300, assuming the impeller thrust is Fvi, and the repulsive force between magnets is Fc, and according to the equation $Fvi+Ff=G+Fc$, obtaining the repulsive force Fc between the magnets under a condition of known impeller thrust Fvi, or obtaining the impeller thrust Fvi under a condition of known repulsive force Fc between the magnets, so as to obtain design parameters of the magnets and the rotating speed of a driving shaft when the driving shaft rotates stably.

The inventors of this application further analyze the reasons for the easy wear of the conventional magnetic stirring device: the magnetic stirring device usually drives the material in the middle of the stirring tank to move upward, and these materials will generate an impact force acting downward on the impeller assembly. This impact force will increase continuously with the increase of the stirring speed of the material. In addition, due to the downward setting of the gravity of the impeller assembly, a limiting structure needs to be set on the isolation sleeve to bear the action of both gravity and impact force. Moreover, with the increase of the stirring speed, the impact force will continue to increase, it will further exacerbate the force acting on the limiting structure, cause wear and deformation of the limiting structure, thereby contaminating the material or causing cleaning difficulties where the wear and deformation occur.

In addition, when bottom-entry and inclined stirring is used, the liquid moves upward in a spiral motion, and rotation easily forms a vortex in the shape of a downward-centered funnel. This vortex seems to flow violently, but it is actually circumferential flow, with weak mass transfer performance, and it is easy to bring gas from the gas phase space into the liquid.

Based on this, the inventors of this application have developed a bottom-entry magnetic stirring device, which is set at the bottom of the stirring tank. By setting the impeller assembly to be movably connected along the axial direction with the isolation sleeve, the impeller assembly is suitable for driving the material in the middle of the stirring tank to move downward. The isolation sleeve is provided with a limiting structure, and the limiting structure is set at the upper part of the impeller assembly and is suitable for generating a magnetic force acting downward on the impeller assembly, thereby limiting the impeller assembly to be in a suspended state during stable rotation. In addition, the impeller assembly can drive the material in the middle of the stirring tank to move downward, so that these materials can exert an upward impact force on the impeller assembly, counteracting the gravity of the impeller assembly. The impact force will increase continuously with the increase of the stirring speed until it completely exceeds the gravity of the impeller assembly. At this time, the limit force is generated by the limiting structure to limit the maximum upward displacement of the impeller assembly, effectively reducing the force acting on the limiting structure during use (the force and the downward limit force generated by the limiting structure are equal in magnitude but opposite in direction, and they are a pair of action and reaction forces), thereby reducing the force on the limiting structure, reducing the wear and deformation of the limiting structure, reducing the possibility of material contamination, and reducing the difficulty of cleaning caused by material residue at the worn and deformed parts. It is worth mentioning that stable rotation refers to the stable rotating speed of the impeller assembly. The impeller assembly does not have any up and down leap movement along the axial direction and is in a suspended state with respect to the isolation sleeve. Therefore, when the impeller assembly is in a stable state, the material in the middle of the stirring tank will exert an upward impact force on the impeller assembly due to the downward movement driven by the impeller assembly. This impact force will also be in a stable state when the impeller assembly is in a stable state. Therefore, the upward impact force, the downward gravity of the impeller assembly, the buoyancy acting on the impeller assembly, and the magnetic repulsion force acting on the impeller assembly by the limiting structure form a stable state, keeping the impeller assembly in a suspended state.

In addition, the bottom-entry magnetic stirring device of the present application drives the liquid to move in a spiral upward motion, forming a flow field with strong mass transfer performance, thereby increasing the uniformity of liquid stirring.

Due to the ability to achieve the axial movable connection between the impeller assembly and the isolation sleeve, the isolation sleeve restricts the axial movement distance of the impeller assembly through the principle of magnetic levitation. The impeller assembly is suitable for driving the material in the middle of the stirring tank to move downward. The isolation sleeve is set with a downward magnetic force towards the impeller assembly, and the function of being in a suspended state when the impeller assembly rotates makes the design of the bottom-entry stirring device be complicated, so that the inventors of the present application further design and analyze, and develop a design method for this type of stirring device: first, analyse the physical shape of the conventional impeller assembly and use simulation software to analyze the weight m and volume Vf of the impeller assembly 2. It is worth mentioning that the physical shape of the impeller assembly comprises the impeller diameter and the impeller inclination angle. In order to make the impeller assembly able to push the material in the middle of the stirring tank to move downward, the appropriate impeller inclination angle and the rotation direction of the impeller assembly can be reasonably selected to achieve the impeller assembly pushing the material in the middle of the stirring tank to move downward. According to the formula Fvi+Ff=G+Fc, when the impeller thrust is known as Fvi or the repulsive force between the magnets is known as Fc, the repulsive force between the magnets Fc or the impeller thrust Fvi can be obtained, and then the design parameters of the magnets and the rotating speed of the driving shaft when the driving shaft stably rotates can be obtained. By using the physical shape of the conventional impeller assembly, it can avoid the need for additional moldmaking and can reduce investment costs. It can also more conveniently obtain the volume and weight of the impeller assembly, thereby facilitating the calculation of the design parameters of the driving shaft or the design parameters of the magnets. In this specific embodiment, the design parameters of the magnets comprise the spacing between the first magnet and the second magnet.

Preferably, the design method of bottom-entry magnetic stirring further comprises a step: S400, obtaining the impeller thrust Fvi which satisfies the formula $$F_{vi} = 255 \times 10^5 \times \frac{P_q}{D_j \times n} \times tg\theta,$$

so as to obtain the value of the repulsive force Fc between magnets, and shapes and relative position between first magnet and second magnet are thus capable of being adjusted for meeting the relationship requirement determined by the repulsive force Fc between the magnets, wherein parameters of a driving motor are known, the parameters includes the rotating speed n of the impeller assembly when the impeller assembly is in stable rotation, and the output power $P_q$ of the driving shaft, and at the same time, assuming the diameter Dj of the impeller assembly and the blade inclination angle θ of the impeller assembly are known.

Preferably, the design method of bottom-entry magnetic stirring device further comprises a step: S500, determining the distance r between the first magnet and the second magnet when the impeller assembly rotates stably according to the formula $F_c=(\mu_0 \times H_1 \times A_1 \times H_2 \times A_2)/(4\pi \times r^2)$, wherein the shape and magnetic field strength of the first magnet and the second magnet are known, the cross-sectional area of the first magnet perpendicular to the direction of the magnetic field is determined to be $A_1$, the cross-sectional area of the second magnet perpendicular to the direction of the magnetic field is $A_2$, the magnetic field strength of the first magnet is $H_1$, the magnetic field strength of the second magnet is $H_2$, the magnetic permeability in vacuum is $\mu_0$.

Preferably, the design method of bottom-entry magnetic stirring device further comprises a step of determining the magnetic field strength $H_1$ of the first magnet and the magnetic field strength $H_2$ of the second magnet according the formula $$H = Br \times \left( \frac{h + 0.5}{\sqrt{(1+2h)^2 + D^2 - d^2}} - \frac{0.5}{\sqrt{1 + D^2 - d^2}} \right) \times 7.95 \times 10^5,$$

wherein the first magnet and the second magnet are both annular magnets, and the outer diameter of the first magnet is D1, the inner diameter of the first magnet is d1, the thickness of the first magnet is h1, the outer diameter of the second magnet is $D_2$, and the inner diameter of the second magnet is d2, the thickness of the second magnet is h2, and according to the hysteresis loop, the residual magnetic induction intensities of the first magnet and the second magnet are $Br_1$ and $Br_2$ respectively. It is worth mentioning that the formula $$H = Br \times \left( \frac{h + 0.5}{\sqrt{(1+2h)^2 + D^2 - d^2}} - \frac{0.5}{\sqrt{1 + D^2 - d^2}} \right) \times 7.95 \times 10^5$$

is the derived formula of Coulomb's law.

Preferably, the design method of bottom-entry magnetic stirring device further comprises the following steps:

S600, obtaining the cross-sectional area $A_1$ of the first magnet perpendicular to the magnetic field direction, the cross-sectional area $A_2$ of the second magnet perpendicular to the magnetic field direction, the magnetic field strength $H_1$ of the first magnet, the magnetic field strength $H_2$ of the second magnet, and the magnetic permeability $\mu_0$ in vacuum when the shapes and magnetic field strengths of the first magnet and the second magnet, and the distance r between the first magnet and the second magnet when the impeller assembly is stably rotating are assumed to be known, and obtaining the repulsive force Fc between magnets when the impeller assembly is stably rotating according to the formula $F_c=(\mu_0 \times H_1 \times A_1 \times H_2 \times A_2)/(4\pi \times r^2)$; and S700, obtaining the impeller thrust Fvi according to the equation Fvi=Fc+G−Ff, and obtaining the value of the rotating speed n of the driving shaft when the impeller assembly is stably rotating according to the formula $$P_q = \left(\frac{n}{60}\right)^3 \times \left(\frac{D_j}{1000}\right)^5 \times N_p,$$

so as to further obtain the blade inclination angle θ of the impeller assembly according to the formula $$F_{vi} = 255 \times 10^5 \times \frac{P_q}{D_j \times n} \times tg\theta,$$

wherein parameters of the driving motor including the output power $P_q$, the power number $N_p$ of the driving motor, the diameter Dj of the impeller assembly are assumed to be known.

Preferably, the design method of bottom-entry magnetic stirring device further comprises the following steps:

S600, obtaining the cross-sectional area $A_1$ of the first magnet perpendicular to the magnetic field direction, the cross-sectional area $A_2$ of the second magnet perpendicular to the magnetic field direction, the magnetic field strength $H_1$ of the first magnet, the magnetic field strength $H_2$ of the second magnet, and the magnetic permeability $\mu_0$ in vacuum when the shapes and magnetic field strengths of the first magnet and the second magnet, and the distance r between the first magnet and the second magnet when the impeller assembly is stably rotating are assumed to be known, and obtaining the repulsive force Fc between magnets when the impeller assembly is stably rotating according to the formula $F_c=(\mu_0 \times H_1 \times A_1 \times H_2 \times A_2)/(4\pi \times r^2)$; and S700, obtaining the impeller thrust Fvi according to the equation Fvi=Fc+G−Ff, and obtaining the value of the diameter Dj of the impeller assembly and the value of the rotating speed n of the driving shaft according to the formula $$P_q = \left(\frac{n}{60}\right)^3 \times \left(\frac{D_j}{1000}\right)^5 \times N_p$$

and the formula $$F_{vi} = 255 \times 10^5 \times \frac{P_q}{D_j \times n} \times tg\theta,$$

wherein parameters of the driving motor including the output power $P_q$, the power number $N_p$ of the driving motor, the blade inclination angle θ of the impeller assembly are assumed to be known.

Preferably, the installation angle of the impeller assembly is α, and the installation angle α is the angle between the impeller assembly and the axis of rotation, wherein the axial component of gravity is G1=G×cos α, and the axial component of buoyancy is Ff=$\rho_{liquid}$×g×Vf, meeting the formula $F_{vi}+F_f=G_1+F_c$.

Preferably, a lower part of the isolation sleeve is provided with a third magnet, and a lower part of a transmission seat is provided with a fourth magnet coupled with the third magnet, and a magnetic force Fx repelling each other in the up and down directions is generated between the third magnet and the fourth magnet, and the impeller assembly is in a suspended state with respect to the isolation sleeve when the impeller assembly is not started, and the distance $r_1$ between the first magnet and the second magnet is controlled to be greater than 5r, according to the formula $F_f+F_x=G$, the value of the magnetic force Fx is obtained, and thus the third magnet and the fourth magnet capable of generating the magnetic force Fx of the required value and direction are selected.

Preferably, the design method of bottom-entry magnetic stirring device further comprises a step of obtaining the distance $r_2$ between a third magnet and a fourth magnet when the impeller assembly is not started and is in a suspended state with respect to the isolation sleeve according to the formula $F_x=(\mu_0 \times H_3 \times A_3 \times H_4 \times A_4)/(4\pi \times r_2^2)$, wherein the magnetic field intensity of the third magnet is $H_3$, the magnetic field intensity of the fourth magnet is known as $H_4$, the cross-sectional area of the third magnet perpendicular to the direction of the magnetic field is $A_3$, and the cross-sectional area of the fourth magnet perpendicular to the direction of the magnetic field is $A_4$, and the magnetic permeability in vacuum is $\mu_0$.

Preferably, the impeller assembly is controlled to be in the suspended state when the impeller assembly is not started, wherein the distance $r_2$ between the third magnet and the fourth magnet satisfies the formula $r_1-r>5r_2$.

Preferably, a sliding column is provided at the top of the isolation sleeve in an upwardly protruding manner along the axial direction, and the sliding column is fixedly connected to the isolation sleeve, wherein the impeller assembly comprises a transmission seat and an impeller body, the impeller body is fixedly connected to the transmission seat and is arranged in the vertical direction, the transmission seat is sleeved outside the isolation sleeve, the driving shaft drives the transmission seat to transmit power through magnetic transmission, and drives the impeller body to rotate, thereby driving the material in the middle of the stirring tank to move downward, the impeller body is sleeved outside the sliding column, and an inner wall of the impeller body is arranged for abutting against an outer peripheral surface of the sliding column and limiting the radial displacement of the impeller body, the sliding frictional force between the impeller body and the sliding column is Fm which is capable of being measured experimentally, wherein when the impeller assembly rotates stably, the formula $F_{vi}+F_f+F_m=G+F_c$ is satisfied.

Compared with the prior art, the advantageous effect of the present application is as follows.

(1) Since the bottom-entry magnetic stirring device is set at the bottom of the stirring tank, the impeller assembly can drive the material in the middle of the stirring tank to move downwards, so that these materials can generate an upward impact force on the impeller assembly and counteract the gravity of the impeller assembly. The impact force will continuously increase as the stirring speed increases, until it completely exceeds the gravity of the impeller assembly. At this time, a downward limiting force is generated by the limiting structure to restrict the maximum upward displacement of the impeller assembly, so as to effectively reduce the force acting on the limiting structure during use (the force and the downward limit force generated by the limiting structure are equal in magnitude but opposite in direction, and they are a pair of action and reaction forces), thereby reducing the force on the limiting structure, reducing the wear and deformation of the limiting structure, reducing the possibility of material contamination, and reducing the difficulty of cleaning caused by material residue in the worn and deformed areas.

(2) In addition, the bottom-entry magnetic stirring device of the present application can drive the liquid to move upward in a spiral motion, forming a flow field with strong mass transfer performance, thereby increasing the uniformity of liquid stirring.

(3) By utilizing the physical shape of the conventional impeller assembly, it is possible to avoid the need for additional molds and reduce investment costs. Additionally, it is more convenient to determine the volume and weight of the impeller assembly, thus facilitating the calculation of the design parameters for the driving shaft or the design parameters for the first magnet and the second magnet. In this specific embodiment, the design parameters for the magnets include the spacing distance between the first magnet and the second magnet.

Figure 1:
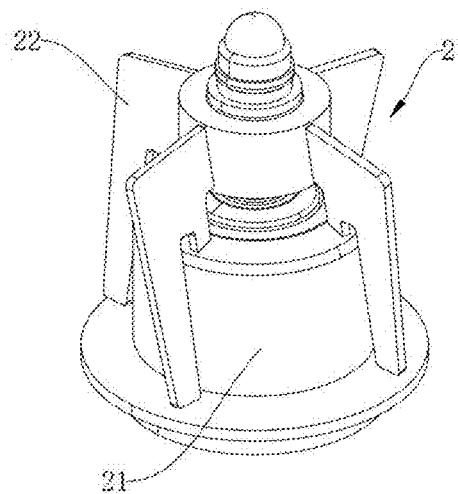
FIG. 1 is a schematic diagram of an embodiment of a magnetic stirring device according to the present application.

In the drawings: 1, isolation sleeve; 11, limiting structure; 12, sliding column; 121, first magnet; 13, mounting portion; 131, third magnet; 2, impeller assembly; 21, transmission seat; 211, transmission magnet; 212, fourth magnet; 22, impeller body; 221, second magnet; 100, driving shaft; 101, driving magnet; 200, stirring tank.

DETAILED DESCRIPTION OF THE PREFERRED EMBODIMENT

Next, in conjunction with specific embodiments, further description of the present application will be made. It should be noted that, under the premise of non-conflict, the various embodiments described below or the various technical features can be combined in any manner to form new embodiments.

In the description of this application, it should be noted that for directional words, such as the term "center", "horizontal", "vertical", "length", "width", "thickness", "up", "down", "front", "back", "left", "right", "vertical", "horizontal", "top", "bottom", "inside", "outside", "clockwise", "counterclockwise", and other directional and positional relationships indicated are based on the orientation or positional relationships shown in the accompanying drawings. They are only used for the convenience of describing this application and simplifying the description, and do not indicate or imply that the device or component referred to must have a specific orientation, be constructed and operated in a specific orientation. They should not be understood as limiting the specific scope of protection of this application.

It should be noted that the terms "first", "second", etc. in the specification and claims of this application are used to distinguish similar objects, and do not necessarily indicate a specific order or sequence.

The terms "include" and "have" and any variations thereof used in the specification and claims of this application are intended to be non-exclusive, for example, a process, method, system, product, or device that includes a series of steps or units is not limited to those steps or units specifically listed, but may include other steps or units inherent to these processes, methods, products, or devices that are not clearly listed.

Further analysis by the inventors of this application reveals that the reason for the easy wearing of the conventional magnetic stirring device is that the magnetic stirring device typically drives the material in the middle of the stirring tank 200 to move upward, and the material exerts a downward impact force on the impeller assembly 2, and this impact force increases with the increase of the stirring speed. In addition, due to the downward gravity of the impeller assembly 2, a limiting structure 11 needs to be set on the isolation sleeve 1 to withstand the action of both gravity and impact force. As the stirring speed increases, the impact force also increases, further intensifying the force acting on the limiting structure 11, causing wear and deformation of the limiting structure 11, thereby contaminating the material or causing cleaning difficulties due to material residue at the worn and deformed area.

In addition, when adopting bottom-entry inclined stirring, the liquid moves upward in a spiral motion, and rotation easily forms a vortex with a downward funnel shape from the liquid surface. This vortex appears to be flowing violently, but it is actually a circumferential flow with weak mass transfer performance, and it is easy to bring gas from the gas phase space into the liquid.

Based on this, the inventors of this application have developed a bottom-entry magnetic stirring device, as shown in FIGS. 1 to 4. The bottom-entry magnetic stirring device is installed at the bottom of the stirring tank 200, and through the movable connection along the axial direction between the impeller assembly 2 and the isolation sleeve 1, the impeller assembly 2 is capable of driving the material in the middle of the stirring tank 200 to move downward. The isolation sleeve 1 is equipped with a limiting structure 11 which is provided at an upper part of the impeller assembly 2 and is capable of generating a magnetic force acting on the impeller assembly 2. This magnetic force has a downward component which restricts the impeller assembly 2 to be in a suspended state during stable rotation. In addition, the impeller assembly 2 can drive the material in the middle of the stirring tank 200 to move downward (of course, the material in the middle of the stirring tank 200 will move downward under the driving of the impeller assembly 2, while the material at the outer periphery of the stirring tank 200 will move upward, thus forming a circulation). As a result, these materials can exert an upward impact force on the impeller assembly 2, counteracting the gravitational force of the impeller assembly 2. This impact force will increase continuously with the increase of the stirring speed until it completely exceeds the gravitational force of the impeller assembly 2. At this time, the limiting structure 11 generates a downward limiting force, which restricts the maximum upward displacement of the impeller assembly 2, effectively reducing the force acting on the limiting structure 11 during use (the force and the downward limit force generated by the limiting structure 11 are equal in magnitude but opposite in direction, and they are a pair of action and reaction forces), thereby reducing the force acting on the limiting structure 11, thereby reducing the wear and deformation of the limiting structure 11, reducing the possibility of material contamination, and reducing the difficulty of cleaning caused by material residue in the worn and deformed areas. It is worth mentioning that stable rotation refers to the stable rotating speed of the impeller assembly 2. The impeller assembly 2 does not move up and down with a leap and is in a suspended state relative to the isolation sleeve 1. Therefore, when the impeller assembly 2 is in a stable state, the material in the middle of the stirring tank 200, driven by the impeller assembly 2, will exert an upward impact force on the impeller assembly 2. This impact force will also be in a stable state when the impeller assembly 2 is in a stable state. Therefore, the upward impact force, the downward gravity of the impeller assembly 2, the buoyancy acting on the impeller assembly 2, and the magnetic repulsive force acting on the impeller assembly 2 from the limiting structure 11 form a stable state, keeping the impeller assembly 2 in a suspended state. It is easy to understand that assuming the rotating speed of the impeller assembly 2 is the same, the speed at which the material moves upward or downward is the same, so that the value and direction of the impact force of the material on the impeller assembly 2 are the same but opposite. When the impact force of the material on the impeller assembly 2 is downward, the value of the limiting force of the limit assembly is approximately equal to the sum of the value of the impact force of the material on the impeller assembly and the value of the gravitational force. When the impact force of the material on the impeller assembly 2 is upward, the value of the limiting force of the limit assembly is approximately equal to the difference between the value of the impact force of the material on the impeller assembly and the value of the gravitational force. When the value of the impact force is the same, it is obvious that when the impact force of the material on the impeller assembly 2 is upward, the value of the limiting force of the limit assembly is smaller.

In addition, the bottom-entry magnetic stirring device of the present application drives the liquid to move upward in a spiral motion, forming a strong mass transfer flow field, thereby increasing the uniformity of liquid stirring.

Figure 2:
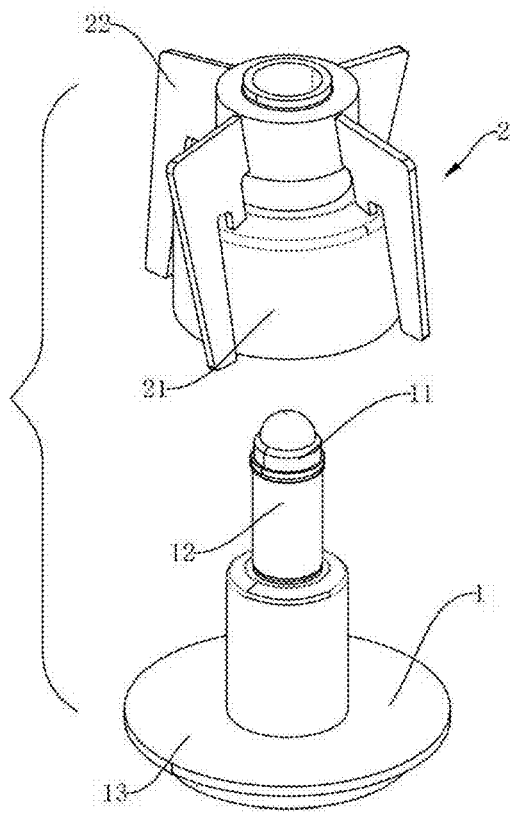
FIG. 2 is an exploded view of the embodiment of the magnetic stirring device of the present application.
Figure 3:
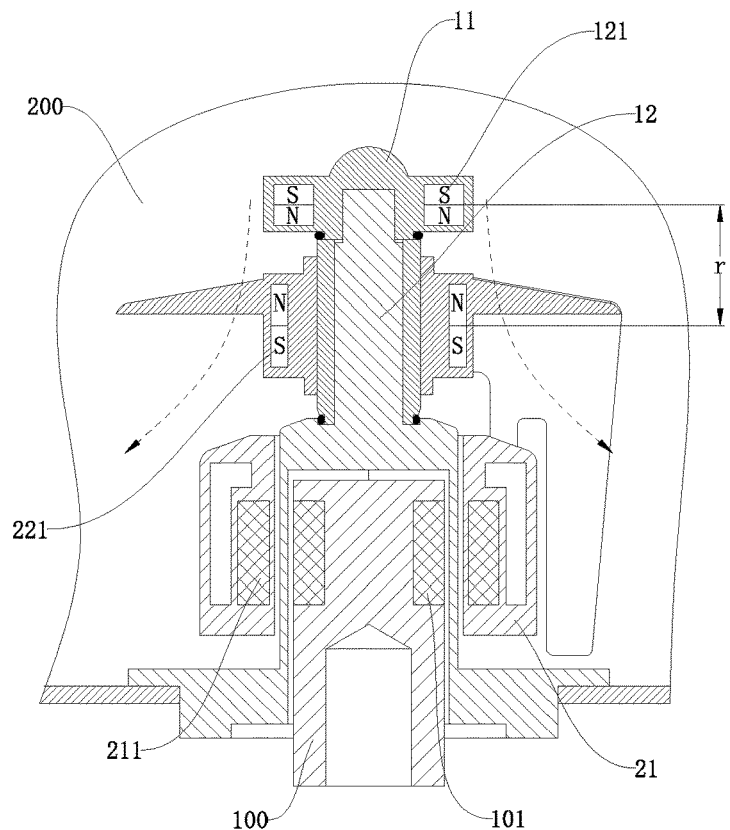
FIG. 3 is a sectional view of the embodiment of the magnetic stirring device of the present application, showing the first magnet and the second magnet.

In addition, the inventors of the present application have also developed a design method of the bottom-entry magnetic stirring device, the implementation of which is shown in FIGS. 1 to 4. The stirring device comprises an impeller assembly 2 and an isolation sleeve 1. The impeller assembly 2 and the isolation sleeve 1 are axially and movably connected. The isolation sleeve 1 restricts the axial movement distance of the impeller assembly 2 through a magnetic levitation principle. The impeller assembly 2 is adapted to drive the material in the middle of the stirring tank 200 to move downward. The isolation sleeve 1 is arranged to provide a downward magnetic force to maintain the impeller assembly 2 in a suspended state when the impeller assembly 2 rotates. In this specific embodiment, as shown in FIG. 3, a driving magnet 101 is provided on the outer side of the driving shaft 100, and a transmission magnet 211 is provided at the inner side of the impeller assembly 2. The driving magnet 101 and the transmission magnet 211 engage with each other through magnetic attraction, and the driving shaft 100 rotates to drive the impeller assembly 2 to rotate. In addition, a limiting structure 11 is provided on the isolation sleeve 1, and the limiting structure 11 comprises a first magnet 121. A second magnet 221 is provided on the impeller assembly 2. The first magnet 121 and the second magnet 221 are axially arranged by magnetic repulsion, and the magnetic force of the first magnet 121 is set downward against the second magnet 221. In this specific embodiment, the N pole of the first magnet 121 faces downward, and the second magnet 221 is provided on the impeller body 22, with the N pole of the second magnet 221 facing upward. A repulsive magnetic force is generated between the first magnet 121 and the second magnet 221 in the upward and downward directions. Of course, the S pole of the first magnet 121 can also be set downward, and the S pole of the second magnet 221 on the impeller body 22 faces upward, forming a repulsive force in the upward and downward directions between the first magnet 121 and the second magnet 221, thereby exerting a downward limiting force on the impeller body 22 to prevent it from moving upward and detaching from the sliding column 12.

The design method of the magnetic stirring device comprises the following steps.

S100, based on the physical shape of the conventional impeller assembly 2, use simulation software to analyze the weight m and volume Vf of the impeller assembly 2.

S200, calculate the gravity G=m×g and buoyancy of the impeller assembly 2 Ff=$\rho_{liquid}$×g×Vf, where $\rho_{liquid}$=1.0×103 kg/m$^3$ and g=9.8 N/kg.

S300, the impeller thrust is Fvi, and the repulsive force between the magnets is Fc (referring to the repulsive force between the first magnet 121 and the second magnet 221), and satisfy the equation Fvi+Ff=G+Fc. Thus, when the impeller thrust Fvi or the repulsive force between the magnets Fc is known, the repulsive force between the magnets Fc or the impeller thrust Fvi can be obtained, and the design parameters of the magnets (the first magnet and the second magnet) and the rotating speed of the driving shaft 100 when it is stably rotating can be obtained.

Due to the ability to achieve the movable connection of the impeller assembly 2 and the isolation sleeve 1 along the axial direction, the isolation sleeve 1 restricts the movement distance of the impeller assembly 2 along the axial direction through the principle of magnetic levitation. The impeller assembly 2 is suitable for driving the material in the middle of the stirring tank 200 to move downward. The isolation sleeve 1 is set with downward magnetic force and functions to keep the impeller assembly 2 in a suspended state when it rotates. The design of the bottom-entry stirring device is complicated, so that the inventors of this application further design and analyze, and develop a design method for this type of stirring device: first, analyse the physical shape of the conventional impeller assembly 2 and use simulation software to analyze the weight m and volume Vf of the impeller assembly 2. It is worth mentioning that the physical shape of the impeller assembly 2 comprises the impeller diameter and the impeller inclination angle. In order to make the impeller assembly 2 able to push the material in the middle of the stirring tank 200 to move downward, the appropriate impeller inclination angle and the rotation direction of the impeller assembly can be reasonably selected to achieve the impeller assembly 2 pushing the material in the middle of the stirring tank 200 to move downward. According to the formula Fvi+Ff=G+Fc, when the impeller thrust is known as Fvi or the repulsive force between the magnets is known as Fc, the repulsive force between the magnets Fc or the impeller thrust Fvi can be obtained, and then the design parameters of the magnets and the rotating speed of the driving shaft when the driving shaft stably rotates can be obtained. By using the physical shape of the conventional impeller assembly 2, it can avoid the need for additional moldmaking and can reduce investment costs. It can also more conveniently obtain the volume and weight of the impeller assembly 2, thereby facilitating the calculation of the design parameters of the driving shaft or the design parameters of the magnets. In this specific embodiment, the design parameters of the magnets comprise the spacing between the first magnet 121 and the second magnet 221. In this specific embodiment, as shown in FIG. 3, the impeller assembly 2 controls the downward movement of the material in the middle of the stirring tank 200, which can be achieved by controlling the blade inclination angle on the impeller assembly 2 and the rotation direction of the impeller assembly 2, as shown in FIG. 1, wherein the rotation direction of the impeller assembly 2 is clockwise, and the blade inclination is the same as the rotation direction, thereby realizing the impeller assembly 2 driving the material in the middle of the stirring tank 200 to move downward.

Furthermore, the method preferably comprises the following step.

S400, assume the parameters of the drive motor are known, and the speed of the driving shaft 100 is set to n; when the impeller assembly 2 is in stable rotation, its speed is n, and the output power of the driving shaft 100 is $P_q$; at the same time, the diameter Dj of the impeller assembly 2 and the blade inclination angle θ of the impeller assembly 2 are known, so as to obtain the impeller thrust Fvi which satisfies the formula $$F_{vi} = 255 \times 10^5 \times \frac{P_q}{D_j \times n} \times tg\theta;$$

(It is worth mentioning that the above formula is derived from the industry standard "HG/T20569-2013" for mechanical stirring equipment), the value of the repulsive force Fc between the magnets an be obtained; then the shape and positional relationship of the first magnet 121 and the second magnet 221 are adjusted to meet the condition of the repulsive force Fc between the magnets.

Furthermore, it is preferable to comprise the following step: S500, with the shape and magnetic field strength of the first magnet 121 and the second magnet 221 being known, obtain the cross-sectional area $A_1$ of the first magnet 121 perpendicular to the direction of the magnetic field, the cross-sectional area $A_2$ of the second magnet 221 perpendicular to the direction of the magnetic field, the magnetic field strength $H_1$ of the first magnet 121, the magnetic field strength $H_2$ of the second magnet 221, and the magnetic permeability $\mu_0$ in vacuum; based on the formula $F_c = (\mu_0 \times H_1 \times A_1 \times H_2 \times A_2)/(4\pi \times r^2)$, the distance r between the first magnet 121 and the second magnet 221 is obtained when the impeller assembly 2 rotates stably. It should be noted that the shapes and magnetic field strengths of the first magnet 121 and the second magnet 221 are known, and the installation directions of the first magnet 121 and the second magnet 221 are known. The cross-sectional area of the first magnet 121 perpendicular to the magnetic field direction can be obtained as $A_1$, and the cross-sectional area of the second magnet 221 perpendicular to the magnetic field direction can be obtained as $A_2$. In this specific embodiment, as shown in FIG. 3, the cross-sectional area of the first magnet 121 perpendicular to the magnetic field direction can be obtained as $A_1$, and the cross-sectional area of the second magnet 221 perpendicular to the magnetic field direction can be obtained as $A_2$.

Embodiment 1: The known output power P of the driving shaft $P_q=0.42$ kw, rotating speed n=500 rpm, impeller diameter $D_j=150$ mm, blade inclination angle θ=15°, according to the formula $$F_{vi} = 255 \times 10^5 \times \frac{P_q}{D_j \times n} \times tg\theta,$$

thus obtain Fvi=38.7 N. In addition, the weight of the impeller assembly 2 is m=2.2 kg, resulting in the gravity G=21.56 N of the impeller assembly 2. The volume of the impeller assembly 2 is $2.78 \times 10^{-4}$ m$^3$, thus obtain the buoyancy force Ff=2.72 N, and then according to formula Fvi+Ff=G+Fc, Fc=19.86 N is obtained.

The cross-sectional area of the first magnet 121 that perpendicular to the direction of the magnetic field is $A_1=0.001$ mm$^2$, the cross-sectional area of the second magnet 221 perpendicular to the direction of the magnetic field is $A_2=0.001$ mm$^2$, the magnetic field strength $H_1$ of the first magnet 121 is 140667.7 A/m$^2$, the magnetic field strength $H_2$ of the second magnet 221 is 134079.3 A/m$^2$, the magnetic permeability in vacuum $\mu_0=4\pi \times 10^{-7}$ T☐m/A, according the formula $F_c=(\mu_0 \times H_1 \times A_1 \times H_2 \times A_2)/(4\pi \times r^2)$, the distance r between the first magnet 121 and the second magnet 221 when the wheel assembly 2 is stably rotating is obtained to be approximately 9.69 mm.

In this specific embodiment, the magnetic field strength $H_1$ of the first magnet 121 and the magnetic field strength $H_2$ of the second magnet can be measured experimentally, and the specific measurement method is known in the prior art and will not be described here.

Furthermore, it is preferable that both the first magnet 121 and the second magnet 221 are annular magnets, and the outer diameter of the first magnet 121 is D1, the inner diameter is d1, and the thickness is h1; the outer diameter of the second magnet 221 is D2, the inner diameter is d2, and the thickness is h2; according to the hysteresis loop, the residual magnetic induction intensity of the first magnet 121 and the second magnet 221 are Br1 and Br2 respectively, and according to the formula $$H = Br \times \left( \frac{h + 0.5}{\sqrt{(1+2h)^2 + D^2 - d^2}} - \frac{0.5}{\sqrt{1 + D^2 - d^2}} \right) \times 7.95 \times 10^5,$$

the magnetic field strength $H_1$ of the first magnet 121 and the magnetic field strength $H_2$ of the second magnet can be obtained. It is worth mentioning that the formula $$H = Br \times \left( \frac{h + 0.5}{\sqrt{(1+2h)^2 + D^2 - d^2}} - \frac{0.5}{\sqrt{1 + D^2 - d^2}} \right) \times 7.95 \times 10^5$$

is the derived formula of Coulomb's law.

Embodiment 2: In addition to the experimental method, the magnetic field strength $H_1$ of the first magnet 121 and the magnetic field strength $H_2$ of the second magnet 221 can also be obtained by calculation. The outer diameter D1 of the first magnet 121 is 50 mm, the inner diameter d1 is 35 mm, the outer diameter D2 of the second magnet 221 is 55 mm, the inner diameter d2 is 40 mm, and the thickness of both the first magnet 121 and the second magnet 221 is h=6.5 mm. The residual magnetic induction intensity of the first magnet 121 is Br1=1.05T, and the residual magnetic induction intensity of the second magnet 221 is Br2=1.05T. According to the formula $$H = Br \times \left( \frac{h + 0.5}{\sqrt{(1 + 2h)^2 + D^2 - d^2}} - \frac{0.5}{\sqrt{1 + D^2 - d^2}} \right) \times 7.95 \times 10^5,$$

the magnetic field strength $H_1$ of the first magnet 121 is calculated to be 140667.7 A/m, and the magnetic field strength $H_2$ of the second magnet 221 is calculated to be 134079.3 A/m. Then, based on $H_1$ and $H_2$, the distance r between the first magnet 121 and the second magnet 221 when the wheel assembly 2 rotates stably is calculated to be approximately 10 mm.

Furthermore, the method is preferred to comprise the following steps.

S600, with the shape and magnetic field strength of the first magnet and the second magnet, and the distance r between the first magnet and the second magnet when the impeller assembly rotates stably being known, obtain the cross-sectional area $A_1$ of the first magnet perpendicular to the direction of the magnetic field, the cross-sectional area $A_2$ of the second magnet perpendicular to the direction of the magnetic field, the magnetic field strength $H_1$ of the first magnet, the magnetic field strength $H_2$ of the second magnet, and the magnetic permeability $\mu_0$ in vacuum, according to the formula $F_c = (\mu_0 \times H_1 \times A_1 \times H_2 \times A_2)/(4\pi \times r^2)$, the repulsive force Fc between the magnets when the impeller component rotates stably is obtained.

S700, according to the formula $F_{vi} = F_c + G - F_f$, obtain the impeller thrust $F_{vi}$: set the parameters of the driving motor, the output power of the driving shaft Pq, the power number of the driving motor $N_p$, the diameter of the impeller assembly $D_j$ to be known, according to the formula $$P_q = \left( \frac{n}{60} \right)^3 \times \left( \frac{D_j}{1000} \right)^5 \times N_p,$$

the value of the rotating speed n of the driving shaft is determined when the impeller assembly rotates stably, and then according to the formula $$F_{vi} = 255 \times 10^5 \times \frac{P_q}{D_j \times n} \times tg\theta,$$

the blade inclination angle θ of the impeller assembly is obtained.

Embodiment 3: It is known that the first magnet 121 has a cross-sectional area $A_1$ perpendicular to the direction of the magnetic field which is 0.001 mm², the second magnet 221 has a cross-sectional area $A_2$ perpendicular to the direction of the magnetic field which is 0.001 mm², the magnetic field strength $H_1$ of the first magnet 121 is 140667.7 A/m², the magnetic field strength $H_2$ of the second magnet 221 is 134079.3 A/m², the magnetic permeability in vacuum $\mu_0 = 4\pi \times 10^{-7}$ T·m/A, the distance r between the first magnet 121 and the second magnet 221 is 10 mm, according to the formula $F_c = (\mu_0 \times H_1 \times A_1 \times H_2 \times A_2)/(4\pi \times r^2)$, the repulsive force Fc between the magnets can be calculated as 21.14 N.

In this specific embodiment, the magnetic field strength $H_1$ of the first magnet 121 and the magnetic field strength $H_2$ of the second magnet can be measured experimentally, using a specific measurement method known in the prior art, which will not be described here. In addition to the experimental method, the magnetic field strength $H_1$ of the first magnet 121 and the magnetic field strength $H_2$ of the second magnet 221 can also be calculated. The outer diameter D1 of the first magnet 121 is 50 mm, the inner diameter d1 is 35 mm, the outer diameter D2 of the second magnet 221 is 55 mm, the inner diameter d2 is 40 mm, and the thickness of both the first magnet 121 and the second magnet 221 is h=6.5 mm. The residual magnetic induction intensity of the first magnet 121 is Br1=1.05T, and the residual magnetic induction intensity of the second magnet 221 is Br2=1.05T. According to the formula $$H = Br \times \left( \frac{h + 0.5}{\sqrt{(1 + 2h)^2 + D^2 - d^2}} - \frac{0.5}{\sqrt{1 + D^2 - d^2}} \right) \times 7.95 \times 10^5,$$

the magnetic field strength $H_1$ of the first magnet 121 is calculated to be 140667.7 A/m, and the magnetic field strength $H_2$ of the second magnet 221 is calculated to be 134079.3 A/m.

In addition, when it is known that the weight of the impeller assembly 2 is m=2.2 kg, and the gravity G=21.56 N. The volume of the impeller assembly 2 is $2.78 \times 10^{-4}$ m³, thus the buoyancy Ff=2.72 N can be obtained. According to the formula Fvi=Fc+G−Ff, Fvi=39.98 N is obtained.

Furthermore, when it is known that the output power of the driving shaft $P_q$=0.42 kw, the diameter of the impeller $D_j$=150 mm, and the power number of the driving motor $N_p$=9.66. According to the formula $$P_q = \left( \frac{n}{60} \right)^3 \times \left( \frac{D_j}{1000} \right)^5 \times N_p,$$

the rotating speed of the driving shaft n=500 rpm when the impeller assembly is stably rotating is obtained, and then according to the formula $$F_{vi} = 255 \times 10^5 \times \frac{P_q}{D_j \times n} \times tg\theta,$$

the blade inclination angle θ=15° of the impeller assembly is obtained.

Furthermore, as shown in FIG. 3, S600, when the shape and magnetic field strength of the first magnet and the second magnet, and the distance r between the first magnet and the second magnet when the impeller assembly is stably rotating are know. Thus, the cross-sectional area $A_1$ of the first magnet perpendicular to the magnetic field direction, the cross-sectional area $A_2$ of the second magnet perpendicular to the magnetic field direction, the magnetic field strength $H_1$ of the first magnet, the magnetic field strength $H_2$ of the second magnet, and the magnetic permeability $\mu_0$ in vacuum are known. According to the formula $F_c = (\mu_0 \times H_1 \times A_1 \times H_2 \times A_2)/(4\pi \times r^2)$, the repulsive force Fc between the magnets when the impeller assembly is stably rotating can be obtained.

S700, according to the formula Fvi=Fc+G−Ff, obtain the impeller thrust Fvi, when the parameters of the driving motor, the output power of the driving shaft $P_q$, the power number of the driving motor $N_p$, the blade inclination angle $\theta$ of the impeller assembly are known, according to the formula $$P_q = \left(\frac{n}{60}\right)^3 \times \left(\frac{D_j}{1000}\right)^5 \times N_p$$

and the formula $$F_{vi} = 255 \times 10^5 \times \frac{P_q}{D_j \times n} \times tg\theta,$$

the diameter $D_j$ of the impeller assembly that meets the requirements and the rotating speed n of the driving shaft are obtained. It is worth mentioning that maintaining the output power of the driving shaft $P_q$ unchanged, the mixing power will be maintaining unchanged.

Example 4: It is known that the first magnet 121 has a cross-sectional area $A_1$ perpendicular to the direction of the magnetic field which is 0.001 mm², the second magnet 221 has a cross-sectional area $A_2$ perpendicular to the direction of the magnetic field which is 0.001 mm², the magnetic field strength $H_1$ of the first magnet 121 is 140667.7 A/m², the magnetic field strength $H_2$ of the second magnet 221 is 134079.3 A/m², the magnetic permeability in vacuum $\mu_0 = 4\pi \times 10^{-7}$ T·m/A, the distance r between the first magnet 121 and the second magnet 221 is 10 mm, according to the formula $F_c = (\mu_0 \times H_1 \times A_1 \times H_2 \times A_2)/(4\pi \times r^2)$, the repulsive force Fc between the magnets can be calculated as 21.14 N.

In addition, when it is known that the weight of the impeller assembly 2 is m=2.2 kg, and the gravity G=21.56 N. The volume of the impeller assembly 2 is $2.78 \times 10^{-4}$ m³, thus the buoyancy Ff=2.72 N can be obtained. According to the formula Fvi=Fc+G−Ff, Fvi=39.98 N is obtained.

In addition, when it is known that the output power of the driving shaft $P_q$=0.42 kw, the diameter of the impeller $D_j$=150 mm, the power number of the driving motor $N_p$=9.66, and the blade inclination angle $\theta$ is 15°. According to the formula $$P_q = \left(\frac{n}{60}\right)^3 \times \left(\frac{D_j}{1000}\right)^5 \times N_p,$$

and the formula $$F_{vi} = 255 \times 10^5 \times \frac{P_q}{D_j \times n} \times tg\theta,$$

the rotating speed of the driving shaft n can be calculated as 500 rpm, and the diameter Dj of the impeller assembly can be calculated as 150 mm. It is worth mentioning that under the condition that Dj=150 mm, the weight and volume of the impeller assembly 2 still need not to be changed.

For further optimization, the installation angle of the impeller assembly 2 is $\alpha$, and the installation angle $\alpha$ is the angle between the impeller assembly and the axis of rotation. The gravitational force along the axial direction is G1=G×cos $\alpha$, and the buoyancy force along the axial direction is Ff=$\rho_{liquid}$×g×Vf, satisfying the formula Fvi+Ff=G1+Fc. In this specific embodiment, the installation angle of the impeller assembly 2 is 20°. Assuming that the impeller assembly 2 used has a weight of m=2.2 kg, G can be obtained as 21.56. According to G1=G×cos $\alpha$, it can be obtained that G1=20.26 N when $\alpha$=20°. The volume of the impeller assembly 2 is known to be $2.78 \times 10^{-4}$ m³, thereby obtaining the buoyancy force Ff=2.72 N, and then according to the formula Fvi+Ff−G1+Fc, obtain the magnetic parameters or speed of driving shaft under the condition of known impeller thrust Fvi or known magnetic repulsion between magnets.

Figure 4:
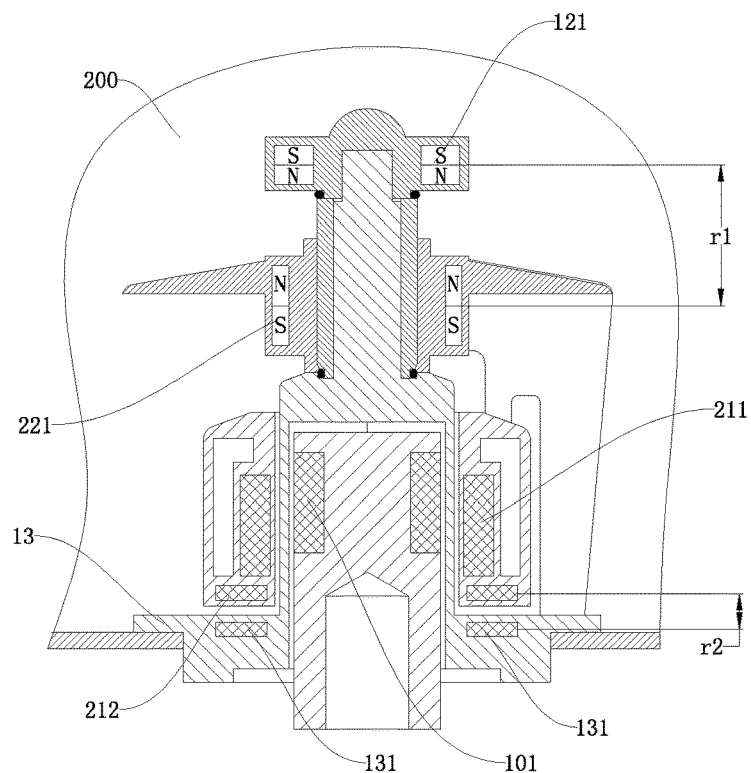
FIG. 4 is a sectional view of another embodiment of the magnetic stirring device of the present application, showing the third magnet and the fourth magnet.

Furthermore, as shown in FIG. 4, the lower part of the isolation sleeve 1 is extended radially outward to form an installation part 13. The installation part 13 is equipped with a third magnet 131. The lower part of a transmission seat 21 is equipped with a fourth magnet 212 that is corresponding to the third magnet 131. The third magnet 131 and the fourth magnet 212 are capable of generating a magnetic force Fx that repels each other in the vertical direction, and the impeller assembly 2 can be in a suspended state with respect to the isolation sleeve 1 when it is not started, and the distance r1 between the first magnet 121 and the second magnet 221 is controlled to be greater than 5r. According to the formula Ff+Fx=G, the value of the magnetic force Fx is obtained, and thus the third magnet 131 and the fourth magnet 212 that can generate the magnetic force Fx of this value and direction can be selected.

As shown in FIG. 4, due to the downward setting of the gravity of the impeller assembly 2, when the impeller assembly 2 is not started, it is not affected by the impact force of the material in the stirring tank 200, and it will move downward. By setting the third magnet 131 and the fourth magnet 212 which is coupled with the third magnet 131, the impeller assembly 2 can be in a suspended state with respect to the isolation sleeve 1 when the impeller assembly 2 is not started. In this specific embodiment, the N pole of the third magnet 131 can be set at the upper part, and the N pole of the fourth magnet 212 can be set at the lower part, so that a magnetic repulsive force is generated between the third magnet 131 and the fourth magnet 212; of course, the S pole of the third magnet 131 can also be set at the upper part, and the S pole of the fourth magnet 212 can be set at the lower part, so that a magnetic repulsive force is generated between the third magnet 131 and the fourth magnet 212. This magnetic force can make the impeller assembly 2 in a suspended state with respect to the isolation sleeve 1 when it is not started. In addition, when the impeller assembly 2 is not started, the distance between the first magnet 121 and the second magnet 221 is r1, and it satisfies r1>5r, which can make the distance between the first magnet 121 and the second magnet 221 larger when the impeller assembly 2 is not started, so that the magnetic force between the first magnet 121 and the second magnet 221 can be neglected. Therefore, according to Ff+Fx=G, the value of the magnetic force Fx can be obtained, and then the third magnet 131 and the fourth magnet 212 that can generate the magnetic force Fx of this value and direction can be selected.

For further optimization, the magnetic field strength of the known third magnet 131 is $H_3$, the magnetic field strength of the fourth magnet 212 is $H_4$, the cross-sectional area of the third magnet 131 perpendicular to the magnetic field direction is $A_3$, and the cross-sectional area of the fourth magnet 212 perpendicular to the magnetic field direction is $A_4$. The magnetic permeability in vacuum is $\mu_0$, according the formula $F_x = ((\mu_0 \times H_3 \times A_3 \times H_4 \times A_4)/(4\pi \times r_2^2)$, calculate the distance $r_2$ between the third magnet 131 and the fourth magnet 212 when the control impeller assembly 2 is not started and is in a suspended state with respect to the isolation sleeve 1.

To generate an appropriate size of Fx, the appropriate distance $r_2$ between the third magnet 131 and the fourth magnet 212 can be obtained by determining the shape of the third magnet 131 and the fourth magnet 212, as well as their positions in the magnetic field.

Furthermore, when the control impeller assembly 2 is not started and is in a suspended state with respect to the isolation sleeve 1, the distance $r_2$ between the third magnet 131 and the fourth magnet 212 satisfies $r_1-r>5r_2$.

In actual use, as the impeller assembly 2 starts and reaches a stable rotating state, the distance it moves upward is $r_1-r$. Therefore, the distance that the fourth magnet 212 moves upward relative to the third magnet 131 is $r_1-r$; while when the impeller assembly 2 is not started and is in a suspended state with respect to the isolation sleeve 1, the distance between the third magnet 131 and the fourth magnet 212 is $r_2$, which satisfies $r_1-r>5r_2$, that is, when the impeller assembly 2 is in a stable motion state, the magnetic force between the third magnet 131 and the fourth magnet 212 can be ignored for the axial movement of the impeller assembly 2, making it more convenient to calculate the distance r between the first magnet 121 and the second magnet 221.

Furthermore, as shown in FIGS. 1 and 2, the sliding column 12 is provided at the top of the isolation sleeve 1 in an upwardly protruding manner along the axial direction, and the sliding column 12 is fixedly connected to the isolation sleeve 1. The impeller assembly 2 comprises the transmission seat 21 and the impeller body 22. The impeller body 22 and the transmission seat 21 are fixedly connected and arranged in the vertical direction. The transmission seat 21 is sleeved outside the isolation sleeve 1. The driving shaft 100 drives the transmission seat 21 through magnetic transmission and drives the impeller body 22 to rotate, thereby driving the material in the middle of the stirring tank 200 to move downward. The impeller body 22 is sleeved on the outside of the sliding column 12, and the inner wall of the impeller body 22 is suitable for abutting against the outer peripheral surface of the sliding column 12 and limiting the radial displacement of the impeller body 22. The sliding friction force between the impeller body 22 and the sliding column 12 is Fm. The value of Fm can be determined experimentally. When the impeller assembly 2 is stably rotating, it satisfies the formula Fvi+Ff+Fm−G+Fc.

Although there is a mirror contact between the impeller body 22 and the sliding column 12, which results in a small frictional force, the size of the contact may affect the design results. Therefore, the formula can be further optimized to satisfy Fvi+Ff+Fm=G+Fc. Additionally, the value of Fm can be determined through experimental measurement.

The above describes the basic principles, main features, and advantages of the present application. Those skilled in the art should understand that the present application is not limited to the above embodiments. The embodiments and descriptions provided in the specification only illustrate the principles of the present application, and various changes and improvements can be made within the scope and spirit of the present application. These changes and improvements fall within the scope of protection as defined by the appended claims and their equivalents.

What is claimed is:

1. A design method of bottom-entry magnetic stirring device, wherein the stirring device comprise an impeller assembly and an isolation sleeve, wherein the impeller assembly and the isolation sleeve are connected along an axial direction in a movable manner, the impeller assembly is capable of driving a material in the middle of a stirring tank to move downward, wherein the isolation sleeve is equipped with a limiting structure which is provided at an upper part of the impeller assembly and is capable of generating a magnetic force acting on the impeller assembly, wherein the magnetic force has a downward component which restricts the impeller assembly to be in a suspended state during stable rotation, the limiting structure comprises a first magnet, and a second magnet is provided on the impeller assembly, the first magnet and the second magnet are axially arranged by magnetic repulsion, and a magnetic force of the first magnet is set downward against the second magnet, wherein the isolation sleeve restricts the axial movement distance of the impeller assembly through the principle of magnetic levitation, and the impeller assembly is in a suspended state during rotating, wherein the design method comprises the following steps:

S100, according to the physical shape of a conventional impeller assembly, analyzing the weight m and the volume Vf of the impeller assembly by simulation software;

S200, calculating the gravity G=m×g and buoyancy Ff=$\rho_{liquid}$×g×Vf of the impeller assembly, and taking $\rho_{liquid}$=1.0×103 kg/m³, g=9.8 N/kg;

S300, assuming the impeller thrust is Fvi, and the repulsive force between the magnets is Fc, and according to the equation Fvi+Ff=G+Fc, obtaining the repulsive force Fc between the magnets under a condition of known impeller thrust Fvi, or obtaining the impeller thrust Fvi under a condition of known repulsive force Fc between the magnets, so as to obtain design parameters of the magnets and the rotating speed of a driving shaft when the driving shaft rotates stably;

S600, obtaining the cross-sectional area $A_1$ of the first magnet perpendicular to the magnetic field direction, the cross-sectional area $A_2$ of the second magnet perpendicular to the magnetic field direction, the magnetic field strength $H_1$ of the first magnet, the magnetic field strength $H_2$ of the second magnet, and the magnetic permeability $\mu_0$ in vacuum when the shapes and magnetic field strengths of the first magnet and the second magnet, and the distance r between the first magnet and the second magnet when the impeller assembly is stably rotating are assumed to be known, and obtaining the repulsive force Fc between the magnets when the impeller assembly is stably rotating according to the formula $F_c=(\mu_0 \times H_1 \times A_1 \times H_2 \times A_2)/(4\pi \times r^2)$; and S700, obtaining the impeller thrust Fvi according to the equation Fvi=Fc+G−Ff, and obtaining the value of the rotating speed n of the driving shaft when the impeller assembly is stably rotating according to the formula $$P_q = \left(\frac{n}{60}\right)^3 \times \left(\frac{D_j}{1000}\right)^5 \times N_p,$$

so as to further obtain the blade inclination angle θ of the impeller assembly according to the formula $$F_{vi} = 255 \times 10^5 \times \frac{P_q}{D_j \times n} \times tg\theta,$$

wherein parameters of a driving motor including the output power $P_q$, the power number $N_p$ of the driving motor, the diameter Dj of the impeller assembly are assumed to be known; or obtaining the value of the diameter Dj of the impeller assembly and the value of the rotating speed n of the driving shaft according to the formula $$P_q = \left(\frac{n}{60}\right)^3 \times \left(\frac{D_j}{1000}\right)^5 \times N_p$$

and the formula $$F_{vi} = 255 \times 10^5 \times \frac{P_q}{D_j \times n} \times tg\theta,$$

wherein the parameter of the blade inclination angle θ of the impeller assembly is assumed to be known.

2. The design method of bottom-entry magnetic stirring device of claim 1, further comprising a step:

S400, obtaining the impeller thrust Fvi which satisfies the formula $$F_{vi} = 255 \times 10^5 \times \frac{P_q}{D_j \times n} \times tg\theta,$$

so as to obtain the value of the repulsive force Fc between magnets, and shapes and relative position between first magnet and second magnet are thus capable of being adjusted for meeting the relationship requirement determined by the repulsive force Fc between the magnets, wherein parameters of the driving motor are known, the parameters includes the rotating speed n of the impeller assembly when the impeller assembly is in stable rotation, and the output power $P_q$ of the driving shaft, and at the same time, assuming the diameter Dj of the impeller assembly and the blade inclination angle θ of the impeller assembly are known.

3. The design method of bottom-entry magnetic stirring device of claim 2, further comprising the following step:

S500, determining the distance r between the first magnet and the second magnet when the impeller assembly rotates stably according to the formula $F_c=(\mu_0 \times H_1 \times A_1 \times H_2 \times A_2)/(4\pi \times r^2)$, wherein the shape and magnetic field strength of the first magnet and the second magnet are known, the cross-sectional area of the first magnet perpendicular to the direction of the magnetic field is determined to be $A_1$, the cross-sectional area of the second magnet perpendicular to the direction of the magnetic field is $A_2$, the magnetic field strength of the first magnet is $H_1$, the magnetic field strength of the second magnet is $H_2$, the magnetic permeability in vacuum is $\mu_0$.

4. The design method of bottom-entry magnetic stirring device of claim 2, further comprising a step of determining the magnetic field strength $H_1$ of the first magnet and the magnetic field strength $H_2$ of the second magnet according the formula $$H = Br \times \left(\frac{h+0.5}{\sqrt{(1+2h)^2 + D^2 - d^2)}} - \frac{0.5}{\sqrt{1+D^2-d^2}}\right) \times 7.95 \times 10^5,$$

wherein the first magnet and the second magnet are both annular magnets, and the outer diameter of the first magnet is D1, the inner diameter of the first magnet is d1, the thickness of the first magnet is h1, the outer diameter of the second magnet is $D_2$, and the inner diameter of the second magnet is d2, the thickness of the second magnet is h2, and according to the hysteresis loop, the residual magnetic induction intensities of the first magnet and the second magnet are $Br_1$ and $Br_2$ respectively.

5. The design method of bottom-entry magnetic stirring device of claim 1, wherein the installation angle of the impeller assembly is α, and the installation angle α is the angle between the impeller assembly and the axis of rotation, wherein the axial component of gravity is G1=G×cos α, and the axial component of buoyancy is Ff=$\rho_{liquid}$×g×Vf, meeting the formula $F_{vi}+F_f=G_1+F_c$.

6. The design method of bottom-entry magnetic stirring device of claim 1, wherein the impeller assembly comprises a transmission seat and an impeller body, the impeller body is fixedly connected to the transmission seat and is arranged in the vertical direction, the transmission seat is sleeved outside the isolation sleeve, the driving shaft drives the transmission seat to transmit power through magnetic transmission, and drives the impeller body to rotate, thereby driving the material in the middle of the stirring tank to move downward, wherein a lower part of the isolation sleeve is provided with a third magnet, and a lower part of a transmission seat is provided with a fourth magnet coupled with the third magnet, and a magnetic force Fx repelling each other in the up and down directions is generated between the third magnet and the fourth magnet, and the impeller assembly is in a suspended state with respect to the isolation sleeve when the impeller assembly is not started, and the distance $r_1$ between the first magnet and the second magnet is controlled to be greater than 5r, according to the formula $F_f+F_x=G$, the value of the magnetic force Fx is obtained, and thus the third magnet and the fourth magnet capable of generating the magnetic force Fx of the required value and direction are selected.

7. The design method of bottom-entry magnetic stirring device of claim 6, further comprising a step of obtaining the distance $r_2$ between the third magnet and the fourth magnet when the impeller assembly is not started and is in a suspended state with respect to the isolation sleeve according to the formula $F_x=(\mu_0 \times H_3 \times A_3 \times H_4 \times A_4)/(4\pi \times r_2^2)$, so that the impeller assembly is controlled to be in the suspended state when the impeller assembly is not started, wherein the distance $r_2$ between the third magnet and the fourth magnet satisfies the formula $r_1-r>5r_2$, wherein the magnetic field intensity of the third magnet is $H_3$, the magnetic field intensity of the fourth magnet is known as $H_4$, the cross-sectional area of the third magnet perpendicular to the direction of the magnetic field is $A_3$, and the cross-sectional area of the fourth magnet perpendicular to the direction of the magnetic field is $A_4$, and the magnetic permeability in vacuum is $\mu_0$.

8. The design method of bottom-entry magnetic stirring device of claim 1, wherein a sliding column is provided at the top of the isolation sleeve in an upwardly protruding manner along the axial direction, and the sliding column is fixedly connected to the isolation sleeve, wherein the impeller assembly comprises a transmission seat and an impeller body, the impeller body is fixedly connected to the transmission seat and is arranged in the vertical direction, the transmission seat is sleeved outside the isolation sleeve, the driving shaft drives the transmission seat to transmit power through magnetic transmission, and drives the impeller body to rotate, thereby driving the material in the middle of the stirring tank to move downward, the impeller body is sleeved outside the sliding column, and an inner wall of the impeller body is arranged for abutting against an outer peripheral surface of the sliding column and limiting the radial displacement of the impeller body, the sliding frictional force between the impeller body and the sliding column is Fm which is capable of being measured experimentally, wherein when the impeller assembly rotates stably, the formula $F_{vt}+F_f+F_m=G+F_c$ is satisfied.

* * * * *